(12) United States Patent
Zhu et al.

(10) Patent No.: US 11,088,351 B2
(45) Date of Patent: Aug. 10, 2021

(54) DISPLAY PANELS AND DISPLAY DEVICES

(71) Applicant: YUNGU (GU'AN) TECHNOLOGY CO., LTD., Langfang (CN)

(72) Inventors: Ping Zhu, Kunshan (CN); Shengfang Liu, Kunshan (CN); Xueyuan Li, Kunshan (CN); Ying Huang, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/735,614

(22) Filed: Jan. 6, 2020

(65) Prior Publication Data

US 2020/0144543 A1 May 7, 2020

Related U.S. Application Data

(63) Continuation of application No. PCT/CN2019/083547, filed on Apr. 19, 2019.

(30) Foreign Application Priority Data

Jul. 20, 2018 (CN) .......................... 201810802563.0

(51) Int. Cl.
*H01L 51/52* (2006.01)
*H01L 27/32* (2006.01)

(52) U.S. Cl.
CPC ...... *H01L 51/5253* (2013.01); *H01L 27/3244* (2013.01); *H01L 51/5259* (2013.01); *H01L 2251/558* (2013.01)

(58) Field of Classification Search
CPC ............. H01L 51/5253; H01L 27/3244; H01L 51/5259; H01L 2251/558
See application file for complete search history.

(56) References Cited

U.S. PATENT DOCUMENTS

| 8,251,766 B2 | 8/2012 | Seo et al. |
| 10,141,541 B1 * | 11/2018 | Li ........................... H01L 51/56 |
| 10,263,215 B2 | 4/2019 | Jin |

(Continued)

FOREIGN PATENT DOCUMENTS

| CN | 101958280 A | 1/2011 |
| CN | 203004462 U | 6/2013 |

(Continued)

OTHER PUBLICATIONS

CN Second Office Action with search report dated Oct. 25, 2019 in the corresponding CN application (application No. 201810802563.0).

*Primary Examiner* — Stephen W Smoot
*Assistant Examiner* — Vicki B. Booker
(74) *Attorney, Agent, or Firm* — Kilpatrick Townsend & Stockton

(57) ABSTRACT

The present disclosure relates to a display panel and a display device. The display panel includes a display substrate and an encapsulating unit. The encapsulating unit is disposed on the display substrate, and the encapsulating unit includes at least one buffer layer. The buffer layer includes a buffer body and first buffer particles. The buffer body is deformable under an action of an external force thereby compressing the first buffer particles, and the first buffer particles are elastically deformable or capable of being crushed by compression.

14 Claims, 7 Drawing Sheets

(56) References Cited

U.S. PATENT DOCUMENTS

| | | | |
|---|---|---|---|
| 2011/0291116 A1* | 12/2011 | Kang | ................. H01L 51/5253 257/88 |
| 2017/0338440 A1 | 11/2017 | Oh et al. | |
| 2018/0149808 A1 | 5/2018 | Yang et al. | |

FOREIGN PATENT DOCUMENTS

| | | |
|---|---|---|
| CN | 204720454 U | 10/2015 |
| CN | 105575995 A | 5/2016 |
| CN | 105702883 A | 6/2016 |
| CN | 106450031 A | 2/2017 |
| CN | 107068901 A | 8/2017 |
| CN | 206505922 U | 9/2017 |
| CN | 107610595 A | 1/2018 |
| CN | 206947399 U | 1/2018 |
| CN | 107819081 A | 3/2018 |
| CN | 109065748 A | 12/2018 |

* cited by examiner

DISPLAY PANELS AND DISPLAY DEVICES

CROSS REFERENCES TO RELATED APPLICATIONS

This application is a continuation application of international patent application PCT/CN2019/083547, filed on Apr. 19, 2019, which claims the priority benefit of Chinese patent application No. 201810802563.0, entitled "DISPLAY PANEL AND DISPLAY DEVICE HAVING THE SAME", and filed on Jul. 20, 2018. The entireties of these applications are incorporated by reference herein for all purposes.

TECHNICAL FIELD

The present application relates to the field of display, such as display panels and display devices including the same.

BACKGROUND

In recent years, with the advance of science and technology, the technology of intelligent terminal devices and wearable devices is developing day by day. The requirements for flat panel display are also gradually increasing, and the demands are becoming more and more diversified. Compared with liquid crystal displays, organic light-emitting diode (OLED) display devices have lower power consumption, higher brightness, faster response speed, and good flexibility, therefore are more and more widely used in smart terminal products such as mobile phones, tablets, and televisions.

SUMMARY

The present application provides a display panel and a display device including the display panel.

A display panel includes a display substrate and an encapsulating unit. The encapsulating unit disposed on the display substrate. The encapsulating unit includes at least one buffer layer. The buffer layer includes a buffer body and a plurality of first buffer particles disposed in the buffer body. The buffer body is deformable under an action of an external force thereby compressing the first buffer particles. The first buffer particles are elastically deformable or capable of being crushed by compression.

In an embodiment, the plurality of first buffer particles are spaced from each other in the buffer body.

In an embodiment, the buffer body is in a flowable colloidal state.

In an embodiment, the buffer body is in a compressible and non-flowable solid state.

In an embodiment, the buffer layer further includes at least one second buffer particle disposed within one of the first buffer particles.

In an embodiment, the second buffer particle includes at least one buffer portion.

In an embodiment, the second buffer particle is an integrated solid sphere including a plastic material.

In an embodiment, the second buffer particle includes a plurality of buffer portions in communication with each other.

In an embodiment, the second buffer particle includes a plurality of buffer portions that are in contact with each other and are not in communication with each other.

In an embodiment, the second buffer particle includes a plurality of nesting buffer portions.

In an embodiment, the second buffer particle is elastically deformable or capable of being crushed under an action of an external force.

In an embodiment, at least one of the first buffer particles and the second buffer particle includes a shell and a buffer core encapsulated in the shell. The shell is elastically deformable or capable of being crushed by compression. The buffer core is capable of being released from the shell under a condition that the buffer shell is crushed.

In an embodiment, the buffer core includes a desiccant capable of undergoing a hydrolysis reaction.

In an embodiment, the desiccant is in a liquid state.

In an embodiment, the shell includes a plastic material having a high light transmittance.

In an embodiment, the buffer layer has a thickness in a range from about 4 μm to about 20 μm.

In an embodiment, a diameter of the first buffer particle is a half of a thickness of the buffer layer. A distribution density of the first buffer particles is in a range from about 500 pcs/mm$^2$ to about 50000 pcs/mm$^2$.

In an embodiment, the encapsulating unit includes a thin film encapsulating layer. The buffer layer is stacked on the thin film encapsulating layer. The thin film encapsulating layer is sandwiched between the buffer layer and the display substrate.

In an embodiment, the display substrate includes a base substrate, a thin film transistor layer, and an organic electroluminescence member layer stacked from bottom to top. The thin film transistor layer is sandwiched between the base substrate and the organic electroluminescence member layer. The buffer layer is disposed on a side of the display substrate adjacent to the organic electroluminescence member layer.

A display device includes the aforementioned display panel.

DETAILED DESCRIPTION

In order to make the present application better understood, embodiments of the application will be fully described hereinafter with reference to the accompanying drawings. However, the application can be embodied in many different forms and is not limited to the embodiments described herein. Rather, these embodiments are provided so that the disclosure of the present application will be more thoroughly understood.

It should be understood that when a member is described as being "fixed to" another member, it can be either directly "fixed on" the other member or indirectly fixed on the other member through an intermediate member. When a member is described as being "connected" to another member, it can be directly connected to the other member or indirectly connected to the other member through an intermediate member. The terms "vertical", "horizontal", "upper", "lower", "left", "right", and the like are used herein for illustrative purposes only.

The inventors discovered that, although OLEDs have relatively good flexibility, the impact resistance of the OLEDs is poor due to material and structural restrictions. When a heavy object strikes the OLED display device, a display defect such as a dark spot, a bright spot, a colored spot, and the like, may occur at the struck area, affecting the service life and the stability of the OLED display device.

Figure 1:
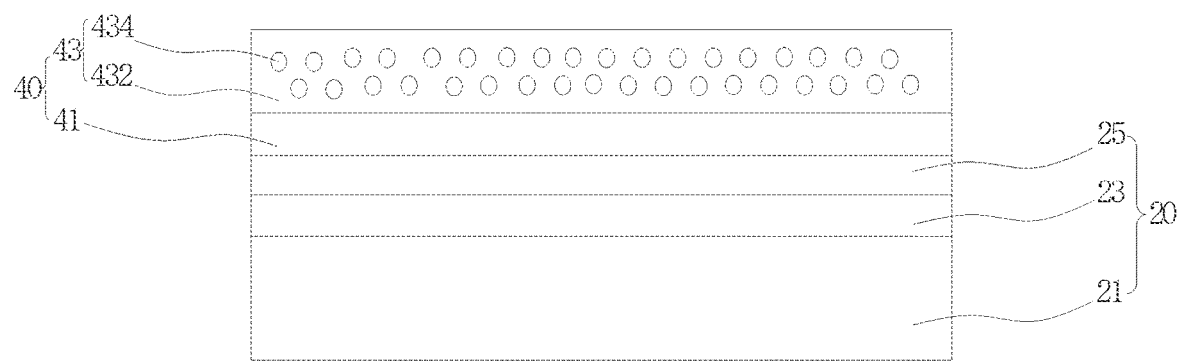
FIG. 1 is a schematic view of an embodiment of a display panel of the present application.

Referring to FIG. 1, an embodiment of the present application provides a display panel 100 including a display substrate 20 and an encapsulating unit 40. The display substrate 20 can be an organic electroluminescence display substrate 20. The encapsulating unit 40 is configured to encapsulate the display substrate 20 to provide sealing and protection to the display substrate 20.

The display substrate 20 includes a base substrate 21, a thin film transistor layer 23, a planarization layer (not shown), and an organic electroluminescence member layer 25. The thin film transistor layer 23, the planarization layer, and the organic electroluminescent member layer 25 are stacked on the base substrate 21 from bottom to top. The thin film transistor layer 23 is positioned between the base substrate 21 and the planarization layer. The organic electroluminescent member layer 25 is positioned on one side of the planarization layer away from the thin film transistor layer 23.

The material of the base substrate 21 can be a flexible polymer material such as polyimide (PI), polyethylene terephthalate (PET), polyethylene naphthalate (PEN). naphthalate (PEN), polycarbonate (PC), polyether sulfone (PES), or fiber reinforced plastic (FRP), so that the base substrate 21 has a good flexibility while providing a supporting effect. The material of the base substrate 21 is not limited thereto. In some embodiments, the base substrate 21 can be formed of other materials as needed.

The thin film transistor layer 23 includes a plurality of thin film transistors arranged as an array on the base substrate 21 for driving the organic electroluminescent member layer 25 to emit light. In some embodiments, the thin film transistor includes a gate electrode formed on the base substrate 21, a gate insulating layer covered on the gate electrode, an active layer formed on the gate insulating layer, and a source electrode and a drain electrode formed on the active layer.

Since the thin film transistor layer 23 has the above-described complicated layered structure, the top surface of the thin film transistor layer 23 may not be flat. Therefore, the planarization layer is covered on the side of the thin film transistor layer 23 away from the base substrate 21 to form a sufficiently flat surface. After the planarization layer is formed, a through hole is formed in the planarization layer to expose the source electrode or the drain electrode of the thin film transistor.

The organic electroluminescent member layer 25 includes a plurality of organic electroluminescent members. Each of the organic electroluminescent members includes a light emitting layer formed of a light emitting material, and an anode and a cathode configured for controlling the light emission of the light emitting layer. The organic electroluminescent member can further include, as needed, one or more layers selected from an electron transporting layer, a hole transporting layer, an electron injection layer, and a hole injection layer. The electron transporting layer and the hole transporting layer are configured for balancing electrons and holes. The electron injection layer and the hole injection layer are configured for enhancing the injection of electrons and holes. Under the action of the applied electric field generated by the thin film transistor layer 23, electrons and holes are generated at the cathode and the anode respectively, and can be injected through the electron injection layer and the hole injection layer into the light emitting material. The injected electrons and holes respectively migrate from the electron transporting layer and the hole transporting layer to the light emitting layer, meet and recombine with each other in the light emitting layer to generate excitons. The excitons transfer energy to the organic light-emitting molecules, and the energy of the organic light-emitting molecules is activated. The electronic state of the organic light-emitting molecules changes from a stable state (ground state) to a high energy state (excited state), and then returns to the original ground state accompanying with an energy released in the form of light, since the excited state is extremely unstable.

The display panel 100 formed with the display substrate 20 has a relatively poor impact resistance due to the material and structural restrictions. In a reliability test of the display panel 100, the display panel 100 is struck by a falling ball (e.g., a steel ball having a weight of 32.65 g and a diameter of 20 mm dropped from a height of 2 cm to 62.5 cm). Since the stress caused by the impact force tends to be concentrated rather than dissipated at the moment when the falling ball strike the display panel 100, the display panel 100 is easy to be damaged, especially when the ball is dropped from a height over 10 cm. The area struck by the ball may unable to have a full-color display, and defects such as a dark spot, a bright spot, and a colored spot may occur. Therefore, how to improve the mechanical reliability of the display panel 100 is one of the important technical challenges in the field at present, and a display panel 100 including the encapsulating unit 40 is provided.

The encapsulating unit 40 includes a thin film encapsulating layer 41 and at least one buffer layer 43. The thin film encapsulating layer 41 covers the surface of one side of the display substrate 20 to protect the display substrate 20 and to provide a buffering effect. Specifically, the thin film encapsulating layer 41 covers the surface of the side of the organic electroluminescent member layer 25 away from the base substrate 21. The buffer layer 43 covers the surface of one side of the thin film encapsulating layer 41 away from the display substrate 20, and further provides a buffering effect to prevent the display substrate 20 from being damaged. The thin film encapsulating layer 41 and the buffer layer 43 collaboratively absorb the external force applied on the surface of the buffer layer 43, and effectively prevent the display substrate 20 from being damaged.

In some embodiments, the thin film encapsulating layer 41 includes a first inorganic layer, an organic layer, and a second inorganic layer (not shown) which are stacked together. The first inorganic layer covers the display substrate 20 to prevent infiltration of water and oxygen to the display substrate 20. The organic layer is located between the first inorganic layer and the second inorganic layer, and has a buffering effect to protect the display substrate 20 and the first inorganic layer. The second inorganic layer covers the organic layer to prevent infiltration of water and oxygen to the organic layer. The buffer layer 43 covers the second inorganic layer to further improve the impact resistance of the display panel 100. The first inorganic layer, the organic layer, the second inorganic layer, and the buffer layer 43 stacked on the display substrate 20 from bottom to top can effectively prevent the water and oxygen infiltration to the display substrate 20 while absorbing the external force, thereby avoiding the display substrate 20 from being damaged under the action of the external force. The specific configuration of the thin film encapsulating layer 41 is not limited thereto, and can be a single-layered, double-layered, or multilayered structure.

The buffer layer 43 includes a buffer body 432 and a plurality of first buffer particles 434 spaced from each other in the buffer body 432. The buffer body 432 can deform under the action of the external force and compresses the first buffer particles 434. The first buffer particles 434 are elastically deformed or crushed by compression.

When the upper surface of the display panel 100 is subjected to the action of the external force, the external force is firstly applied on the buffer layer 43. The buffer body 432 is compressed under the action of the external force to have an elastic deformation to absorb a part of the external force. The external force is further passed to the first buffer particles 434 distributed in the buffer body 432. The first buffer particles 434 are compressed to produce recoverable elastic deformation or to be directly crushed, such that the external force that is not absorbed by the buffer body 432 can be further absorbed by the first buffer particles 434, thereby effectively reducing the magnitude of the external force applied on the display substrate 20, and avoiding the occurrence of the defects such as the dark spots, the bright spots, and the colored spots.

In an embodiment, the buffer body 432 is in a flowable colloidal state. Specifically, the buffer body 432 can be made of a resin adhesive to adhere to the film encapsulating layer 41. The resin adhesive has the flowability to transfer the external force to the first buffer particles 434, and can absorb a part of the external force as well. Moreover, the resin adhesive has good thermal resistance and electrical insulation, and high light transmittance, in order to avoid affecting the light extraction efficiency of the display panel 100.

In some other embodiments, the buffer body 432 can be formed of polymethyl methacrylate, which also has high light transmittance, thermal resistance, and electrical insulation, and is in a compressible and non-flowable solid state. When an external force is applied to the polymethyl methacrylate made buffer body 432, the buffer body 432 can be compressed, thereby compressing the inner first buffer particles 434. The material of the buffer body 432 is not limited thereto, and can be provided according to different needs.

Figure 2:
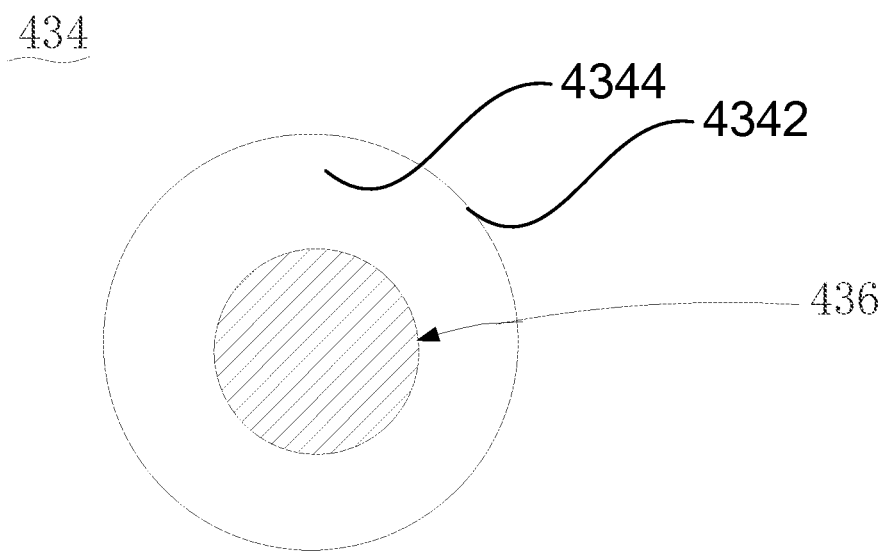
FIG. 2 is a schematic view of an embodiment of a first buffer particle in the display panel of the present application.

Referring to both FIG. 1 and FIG. 2, in some embodiments, the first buffer particle 434 has a buffer capsule structure. The buffer capsule structure is elastically deformable or capable of being crushed under the action of external force to absorb the external force. The buffer capsule structure is a buffer structure having a capsule construction, including a shell and a core encapsulated within the shell. Specifically, the first buffer particle 434 having the buffer capsule structure includes a buffer shell 4342 and a buffer core 4344 encapsulated in the buffer shell 4342. The buffer shell 4342 is deformable or capable of being crushed when compressed by the buffer body 432. When the buffer shell 4342 is compressed by the buffer body 432 to have the elastically deformation, the buffer shell 4342 and the buffer core 4344 both absorb the external force. When the pressure exceeds a threshold value, the buffer shell 4342 is crushed to absorb more external force, and at this time, the buffer core 4344 is capable of being released from the buffer shell 4342 into the buffer body 432.

In an embodiment, the buffer core 4344 is a liquid desiccant capable of undergoing a hydrolysis reaction. When the buffer shell 4342 is crushed, the liquid desiccant can be released from the buffer shell 4342. When the released liquid desiccant encounters water in the buffer body 432, it will absorb the water in the buffer body 432, thereby further avoiding the water infiltration to the display panel 100, and further increasing the service life of the display panel 100.

In an embodiment, the buffer shell 4342 of the first buffer particle 434 is formed of a plastic material (for example, a resin) having high light transmittance, so as not to affect the light extraction efficiency of the display panel 100, and can have a significant deformation under the action of external force thereby having a buffer function. The desiccant includes a cyclic alkoxy aluminum oxide ($[RO—Al=O]_n$, $R=C_mH_{2m+1}CO$). The cyclic alkoxy aluminum oxide reacts with water in the hydrolysis reaction to produce $ROAl(OH)_2$, thereby having a water absorption function. In an embodiment, the chemical equation of the hydrolysis reaction between the cyclic alkoxy aluminum oxide and water is as follows.

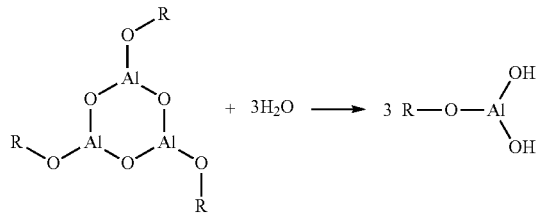

The material of the first buffer particle 434 and the material of the buffer core 4344 are not limited thereto, and can be formed of other materials.

In an embodiment, the buffer layer 43 has a thickness in a range of equal to or larger than 4 μm and equal to or smaller than 20 μm, thereby avoiding a significant increase in the thickness of the display panel 100 while providing an effective buffering effect, and avoiding obstructing the bending of the display panel 100. If a thickness of the buffer layer 43 is less than 4 μm, the thickness is too small to provide an effective buffering effect. If the thickness of the buffer layer 43 exceeds 20 the thickness is too large so that the flexibility of the display panel is decreased. The diameter of the first buffer particle 434 takes a half of the thickness of the buffer layer 43. In an embodiment, the diameter of the first buffer particle 434 is in a range of equal to or larger than 2 μm and equal to or smaller than 10 μm. The distribution density of the first buffer particles 434 is in a range of greater than or equal to 500 pcs/mm$^2$ and smaller than or equal to 50000 pcs/mm$^2$. As such, the first buffer particles 434 have a suitable size and density to avoid affecting the formation of the buffer layer 43 while provide an adequate buffering effect. In some embodiments, the first buffer particle 434 is formed by using a pressing method, and the buffer layer 43 is formed on the thin film encapsulating layer 41 by using a method such as thin film attaching or coating.

Referring to FIG. 2, in some embodiments, the buffer layer 43 further includes a second buffer particle 436, and the second buffer particle 436 is disposed within the first buffer particle 434. When the first buffer particle 434 is crushed under the action of the compressive force, the buffer core 4344 and the second buffer particle 436 can be released. When the buffer layer 43 is subjected to an action of an external force again, the second buffer particle 436 can further absorb a part of the external force, thereby the buffer layer 43 can effectively buffer the external force for multiple times, and further extend the service life of the display panel 100.

The second buffer particle 436 includes at least one buffer portion. In an embodiment, the second buffer particle 436 has a structure similar to the structure of the first buffer particle 434, that is, the buffer capsule structure. In an embodiment, each buffer portion has a structure similar to the buffer capsule structure of the first buffer particle 434.

Referring to FIG. 2, in an embodiment, the second buffer particle 436 includes a buffer portion. The buffer portion is an integrated solid sphere formed of a plastic material. In this embodiment, the second buffer particle 436 is the integrated solid sphere formed of the plastic material. After the first buffer particle 434 is crushed, and the buffer core and the second buffer particle 436 are released, the second buffer particle 436 can have an elastic deformation under an action of the buffer body 432 to absorb the external force.

Figure 3A:
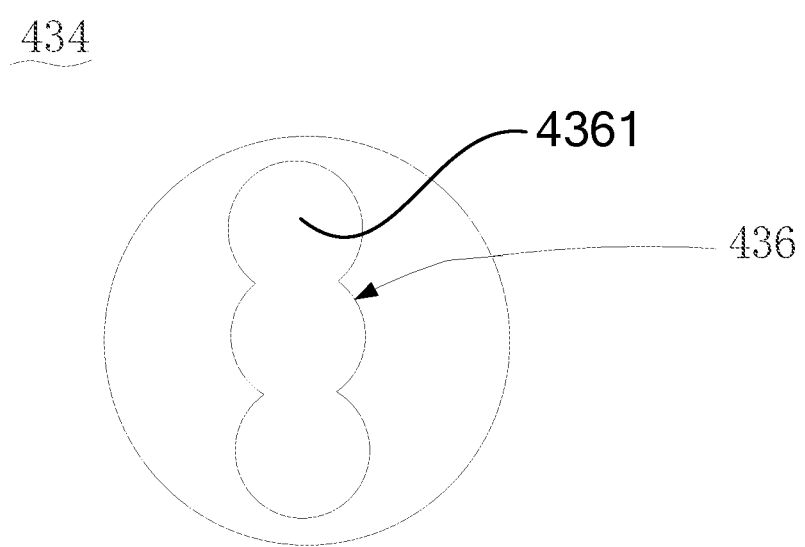
FIGS. 3A-3C each is a schematic view of another embodiment of the first buffer particle in the display panel of the present application.
Figure 3B:
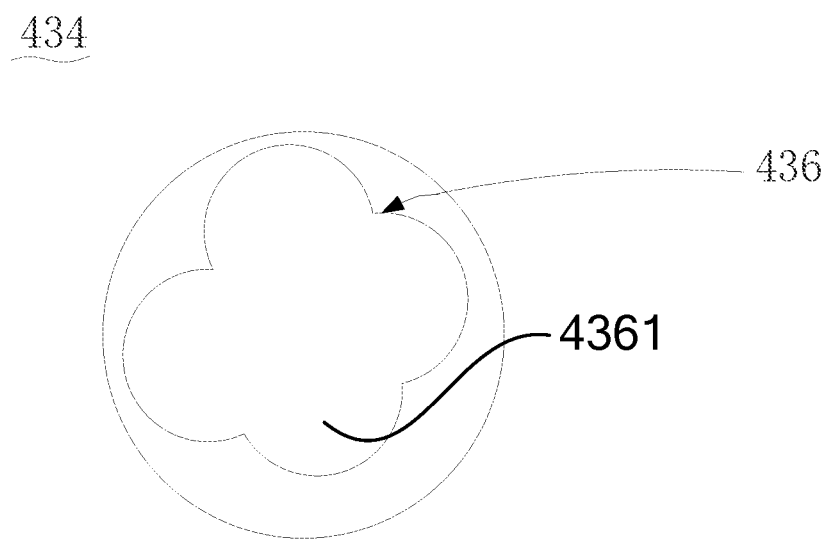
Figure 3C:
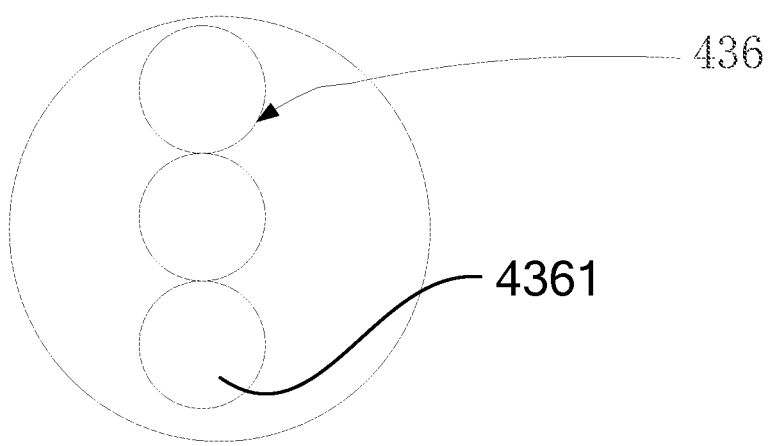

Referring to FIGS. 3A-3C, in some embodiments, the buffer portion of the second buffer particle 436 includes a plurality of interconnected buffer portions 4361. For example, as shown in FIG. 3A, the plurality of buffer portions 4361 are in communication with each other one by one to form a "bottle gourd shaped" structure. As shown in FIG. 3B, the plurality of buffer portions 4361 are converged and in communication with each other to form a "petal shaped" structure. In FIG. 3C, the plurality of buffer portions 4361 are in contact with each other one by one to form a "bottle gourd shaped" structure without being in communication with each other. The shape formed by the plurality of buffer portions 4361 is not limited thereto, and can be provided according to different needs, if only the effect of absorbing the external force by the second buffer particle 436 is achieved.

Figure 4:
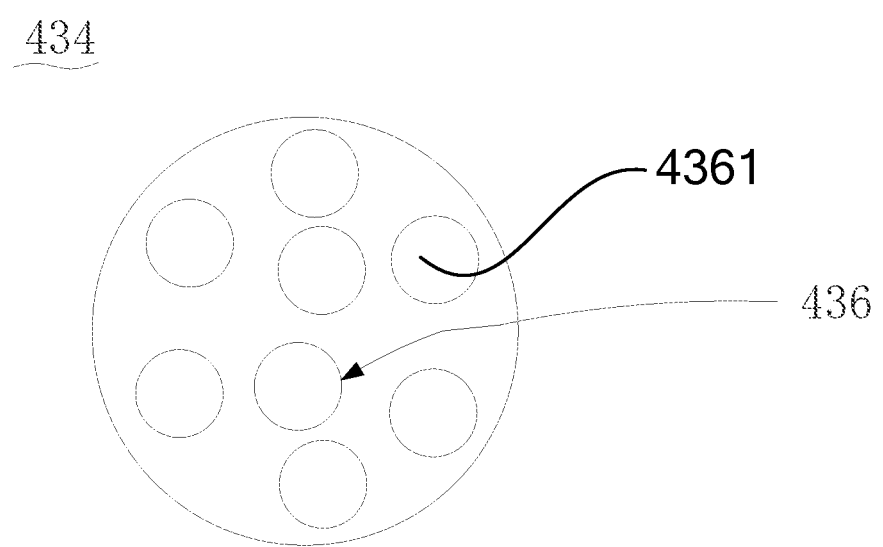
FIG. 4 is a schematic view of yet another embodiment of the first buffer particle in the display panel of the present application.

Referring to FIG. 4, in some embodiments, the second buffer particle 436 includes a plurality of buffer portions 4361 dispersed from each other. The plurality of buffer portions 4361 each has a buffering effect after being released. In an embodiment, the second buffer particle 436 includes a plurality of independent and dispersed buffer portions 4361. After the second buffer particle 436 is crushed and the buffer core and the plurality of buffer portions 4361 are released, at least a part of the plurality of buffer portions 4361 can be elastically deformed or crushed under the action of external force to absorb the external force.

Figure 5:
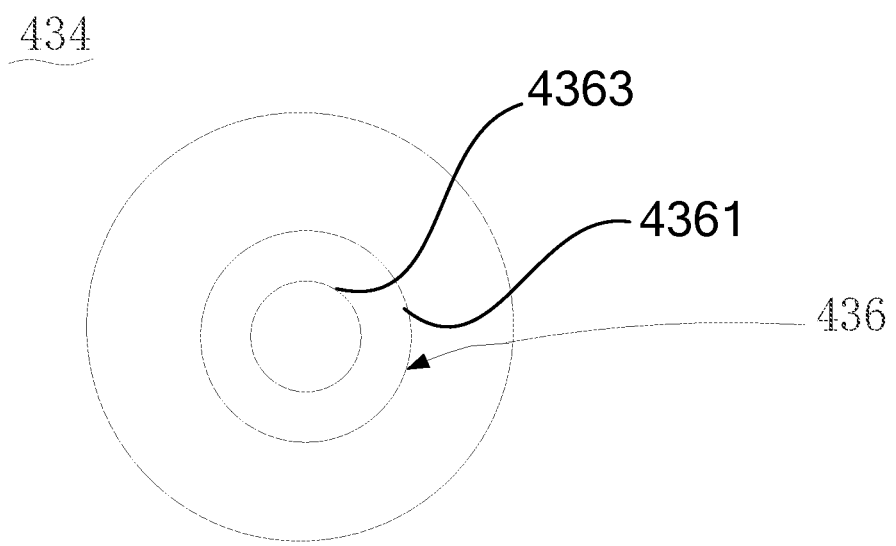
FIG. 5 is a schematic view of yet another embodiment of the first buffer particle in the display panel of the present application.

Referring to FIG. 5, in another embodiment, the second buffer particle 436 includes two nesting buffer portions 4361 and 4363. That is, a larger buffer portion has a buffer core and a smaller buffer portion encapsulated within the buffer shell of the larger buffer portion. The smaller buffer portion also has a buffer core inside. As such, after the outer buffer portion 4361 of the second buffer particle 436 is crushed, the buffer core and the buffer portion 4363 inside the buffer portion 4361 can be released. The released buffer portion 4363 can be crushed and release the buffer core again under the action of the external force to function as a buffer. In another embodiment, the second buffer particle 436 includes a plurality of buffer portions nested one another, and the number of the nesting is not limited, thereby further increasing the number of buffering times for the buffer layer 43, and further extending the service life of the display panel 100. The second buffer particle 436 can include only one buffer portion.

According to the above-described display panel 100, the encapsulating unit 40 for sealing the display substrate 20 has a good buffering effect, and can release the desiccant to absorb moisture infiltrated into the display panel 100 from outside while functioning as a buffer, thereby further increasing the service life of the display panel 100. In the reliability test for the display panel 100, the display panel 100 is struck by the ball (the steel ball having the weight of 32.65 g and the diameter of 20 mm dropped from the height of 2 cm to 62.5 cm), the display panel 100 includes the encapsulating unit 40 having the buffer layer 43, and the display substrate 20 is not damaged even if the ball is dropped from the height exceeding 10 cm. The height that is capable of damaging the display panel 100 for the ball to fall from is much larger than 10 cm.

Based on the above-described display panel 100, the present application further provides embodiments of a display device. In some embodiments, the display device can be a display terminal, such as a tablet computer. In some other embodiments, the display device can be a mobile communication terminal, such as a mobile phone terminal.

In some embodiments, the display device includes the display panel 100 and a control unit for transmitting a display signal to the display panel 100.

In the display device, since the display panel 100 has good mechanical properties, the display device can withstand a certain amount of external force, and has a long service life and good durability.

In the display panel 100 and the display device including the display panel 100 provided in the embodiments of the present application, an encapsulating unit 40 having a buffer layer 43 is formed on the display substrate 20, thereby improving the mechanical properties of the display panel 100. The buffer layer 43 has a relatively good buffering capability, thereby reducing the possibility of causing a damage to the display panel 100 by a heavy object fallen on the surface of the display panel 100, and thereby improving the reliability of the display device including the display panel 100. Moreover, the buffer layer 43 has a water absorbing function to absorb water entering the display panel 100 from outside, thereby prolonging the service life of the display device having the display panel 100.

The technical features of the above-described embodiments can be arbitrarily combined. For the sake of brevity of description, not all possible combinations of the technical features in the embodiments are described. However, as long as there is no contradiction in the combinations of these technical features, the combinations should be considered as in the scope of this specification.

The above embodiments merely illustrate several implementations of this application, and the description thereof is specific and detailed, but shall not be constructed as limiting the scope of the application. It should be noted that, for a person of ordinary skill in the art, variations and improvements can be made without departing from the concept of this application, and these are all within the protection scope of this application. Therefore, the protection scope of this application shall be decided by the appended claims.

The invention claimed is:

1. A display panel, comprising:
a display substrate; and
an encapsulating unit disposed on the display substrate, the encapsulating unit comprising at least one buffer layer,
wherein the at least one buffer layer comprises a buffer body and a plurality of first buffer particles disposed in the buffer body, the buffer body is deformable under an action of an external force thereby compressing the first buffer particles, and the first buffer particles are elastically deformable or capable of being crushed by compression; and wherein the at least one buffer layer further comprises at least one second buffer particle disposed within one of the first buffer particles.

2. The display panel of claim 1, wherein the at least one second buffer particle comprises at least one buffer portion.

3. The display panel of claim 1, wherein the at least one second buffer particle is an integrated solid sphere comprising a plastic material.

4. The display panel of claim 1, wherein the at least one second buffer particle comprises a plurality of buffer portions in communication with each other.

5. The display panel of claim 1, wherein the at least one second buffer particle comprises a plurality of buffer portions that are in contact with each other and are not in communication with each other.

6. The display panel of claim 1, wherein the at least one second buffer particle comprises a plurality of nesting buffer portions.

7. The display panel of claim 1, wherein the at least one second buffer particle is elastically deformable or capable of being crushed under an action of an external force.

8. The display panel of claim 1, wherein at least one of the first buffer particles and the at least one second buffer particle comprises a shell and a buffer core encapsulated in the shell, the shell is elastically deformable or capable of being crushed by compression, and the buffer core is capable of being released from the shell under a condition that the buffer shell is crushed.

9. The display panel of claim 8, wherein the buffer core comprises a desiccant capable of undergoing a hydrolysis reaction.

10. The display panel of claim 9, wherein the desiccant is in a liquid state.

11. The display panel of claim 8, wherein the shell comprises a plastic material having a high light transmittance.

12. A display panel, comprising:
a display substrate; and
an encapsulating unit disposed on the display substrate, the encapsulating unit comprising at least one buffer layer and a thin film encapsulating layer,
wherein the at least one buffer layer comprises a buffer body and a plurality of first buffer particles disposed in the buffer body, the buffer body is deformable under an action of an external force thereby compressing the first buffer particles, and the first buffer particles are elastically deformable or capable of being crushed by compression;
wherein the at least one buffer layer has a thickness in a range from about 4 µm to about 20 µm; and
wherein a diameter of each of the plurality of first buffer particles is a half of a thickness of the at least one buffer layer, and a distribution density of the first buffer particles is in a range from about 500 pcs/mm$^2$ to about 50000 pcs/mm$^2$.

13. The display panel of claim 12, wherein the at least one buffer layer is stacked on the thin film encapsulating layer, and the thin film encapsulating layer is sandwiched between the buffer layer and the display substrate.

14. The display panel of claim 12, wherein the display substrate comprises a base substrate, a thin film transistor layer, and an organic electroluminescence member layer stacked from bottom to top, the thin film transistor layer is sandwiched between the base substrate and the organic electroluminescence member layer, and the at least one buffer layer is disposed on a side of the display substrate adjacent to the organic electroluminescence member layer.

* * * * *